(12) United States Patent
Noda et al.

(10) Patent No.: US 9,997,536 B2
(45) Date of Patent: Jun. 12, 2018

(54) SEMICONDUCTOR MEMORY DEVICE

(71) Applicant: Toshiba Memory Corporation, Minato-ku (JP)

(72) Inventors: Kotaro Noda, Yokkaichi (JP); Kyoko Noda, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 134 days.

(21) Appl. No.: 15/258,196

(22) Filed: Sep. 7, 2016

(65) Prior Publication Data

US 2017/0263630 A1   Sep. 14, 2017

Related U.S. Application Data

(60) Provisional application No. 62/306,185, filed on Mar. 10, 2016.

(51) Int. Cl.
*H01L 27/11582* (2017.01)
*H01L 27/11563* (2017.01)
*H01L 27/11568* (2017.01)

(52) U.S. Cl.
CPC .. *H01L 27/11582* (2013.01); *H01L 27/11568* (2013.01)

(58) Field of Classification Search
None
See application file for complete search history.

(56) References Cited

U.S. PATENT DOCUMENTS

| 2012/0086072 | A1 | 4/2012 | Yun et al. | |
|---|---|---|---|---|
| 2012/0208347 | A1 | 8/2012 | Hwang et al. | |
| 2012/0320677 | A1* | 12/2012 | Maejima | G11C 16/0483 365/185.11 |
| 2014/0001544 | A1* | 1/2014 | Sato | H01L 29/66833 257/330 |
| 2015/0008499 | A1 | 1/2015 | Lee et al. | |

FOREIGN PATENT DOCUMENTS

JP    2010-165794    7/2010

* cited by examiner

*Primary Examiner* — Marc Armand
(74) *Attorney, Agent, or Firm* — Oblon, McClelland, Maier & Neustadt, L.L.P.

(57) ABSTRACT

According to one embodiment, a semiconductor memory device includes a substrate, a stacked body, a columnar section and an interconnection section. The stacked body includes a first insulating layer, a first electrode layer, a second insulating layer, and a second electrode layer. The first insulating layer includes a first surface facing the substrate, and a second surface facing the first electrode layer and opposite to the first surface. The second insulating layer includes a third surface facing the first electrode layer, and a fourth surface facing the second electrode layer and opposite to the third surface. A width of the interconnection section located between the first surface and the second surface in a second direction perpendicular to a stacking direction and a first direction is larger than a width of the interconnection section located between the third surface and the fourth surface in the second direction.

20 Claims, 17 Drawing Sheets

SEMICONDUCTOR MEMORY DEVICE

CROSS-REFERENCE TO RELATED APPLICATION

This application is based upon and claims the benefit of priority from U.S. Provisional Patent Application 62/306,185, filed on Mar. 10, 2016; the entire contents of which are incorporated herein by reference.

FIELD

Embodiments described herein relate generally to a semiconductor memory device.

BACKGROUND

A 3-dimensional structure semiconductor memory device including a memory hole and a silicon body on a substrate has been proposed. The memory hole is formed in a stacked body stacked with a plurality of electrode layers via insulating layers, and the silicon body serving as a channel is provided in the memory hole via a charge storage film. The electrode layer functions as a gate in a memory cell, and is formed by burying a metal material into the stacked body via a groove or the like in the stacked body. Thereafter, an interconnection section is formed by burying a metal material into the groove and the substrate and the interconnection section are electrically connected.

In the case where the groove is formed in the stacked body, a part of the stacked body is removed and the substrate is removed to a prescribed depth. An opening with a decreasing width in a depth direction of the substrate is likely to be formed in the substrate after removing a part of the substrate. When the metal material is buried into the opening like this to form the interconnection section, a width of the interconnection section on a bottom surface may become small to increase a distance between the interconnection section and the silicon body. It is concerned that the increase of the distance between the interconnection section and the silicon body may lead a current to hardly flow in the memory cell.

DETAILED DESCRIPTION

Figure 1:
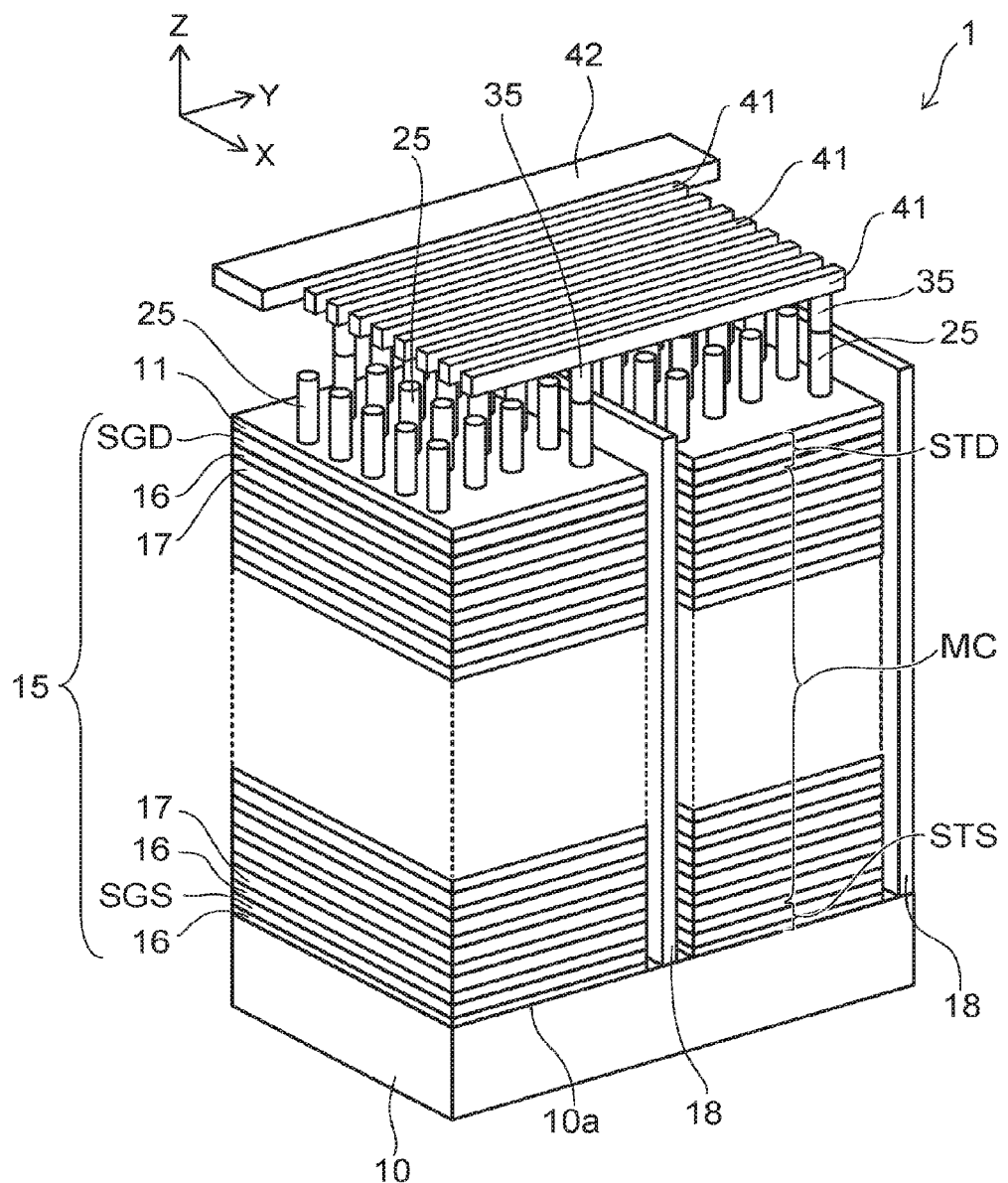
FIG. 1 is a perspective view showing a semiconductor memory device according to an embodiment.

According to one embodiment, a semiconductor memory device includes a substrate, a stacked body, a columnar section and an interconnection section. The stacked body is provided on the substrate, and includes a plurality of insulating layers and a plurality of electrode layers alternately stacked one layer by one layer. The columnar section includes a semiconductor film extending in a stacking direction of the stacked body and a charge storage film provided between the semiconductor film and the stacked body. The interconnection section is provided in the stacked body, expands along the stacking direction and a first direction perpendicular to the stacking direction, and contacts the substrate. The stacked body includes a first insulating layer provided on the substrate, a first electrode layer provided on the first insulating layer, a second insulating layer provided on the first electrode layer, and a second electrode layer provided on the second insulating layer. The first insulating layer includes a first surface facing the substrate, and a second surface facing the first electrode layer. The second surface is a surface opposite to the first surface. The second insulating layer includes a third surface facing the first electrode layer, and a fourth surface facing the second electrode layer. The fourth surface is a surface opposite to the third surface. A width of the interconnection section located between the first surface and the second surface in a second direction perpendicular to the stacking direction and the first direction is larger than a width of the interconnection section located between the third surface and the fourth surface in the second direction.

Various embodiments will be described hereinafter with reference to the accompanying drawings. In the drawings, similar concept is marked with the same reference numerals.

The drawings shown below are schematic. For example, for convenience of viewing the drawings, in some drawings, some constituent elements are omitted or the number of the constituent elements is decreased for drawing. The number of the constituent elements and size ratio are not always matched among drawings.

Embodiment

Figure 2:
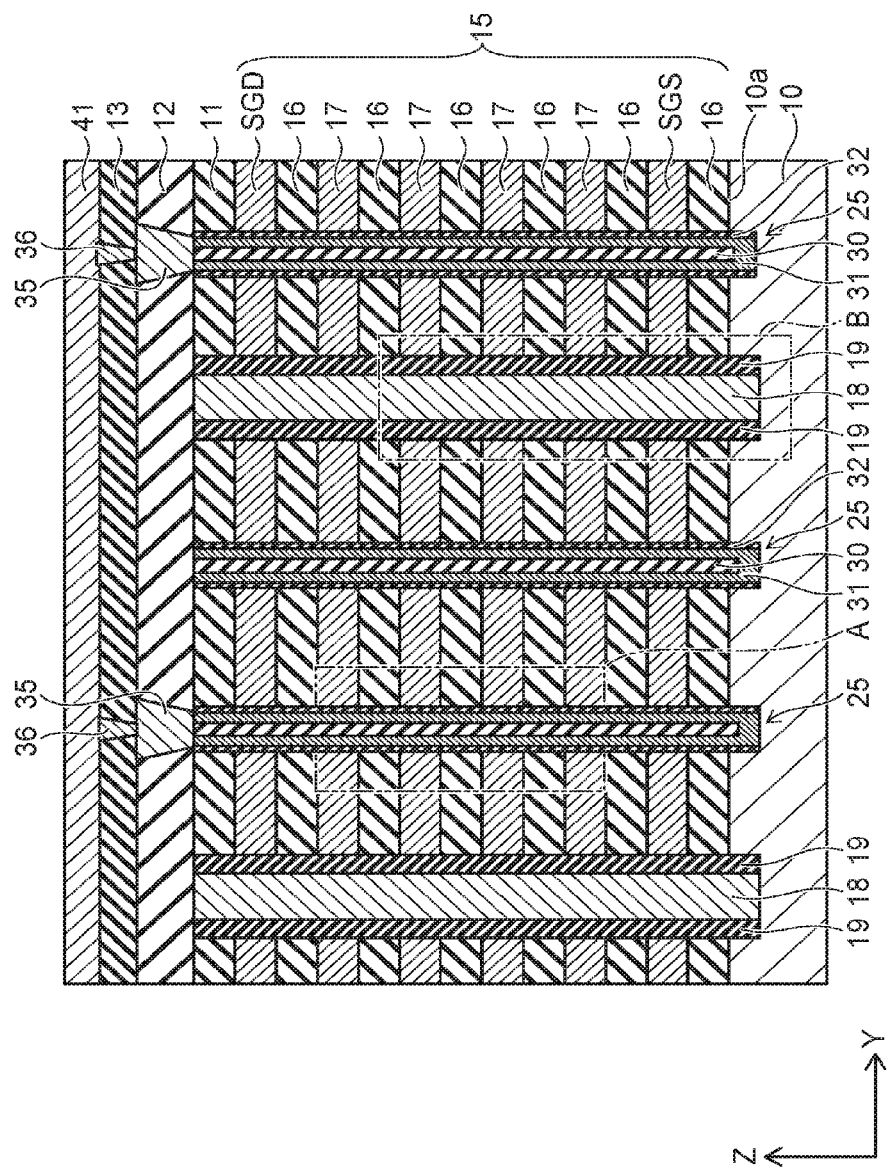
FIG. 2 is a cross-sectional view showing the semiconductor memory device according to the embodiment.

FIG. 1 shows a memory cell array in a semiconductor memory device 1. FIG. 2 shows a Y-Z cross-sectional view of FIG. 1. In FIG. 1, an insulating layer 12, an insulating layer 13 and a contact portion 36 are omitted.

In the semiconductor memory device 1 according to the embodiment, a substrate 10 such as a silicon substrate or the like is provided. Hereinafter, in the specification, for convenience of description, an XYZ orthogonal coordinate system will be used for description. Two directions parallel to an upper surface 10a of the substrate 10 and orthogonal each other are taken as "X-direction" and "Y-direction", and a direction perpendicular to the upper surface 10a of the substrate 10 is taken as "Z-direction".

As shown in FIG. 1, the semiconductor memory device 1 includes a stacked body 15, a columnar section 25, and an interconnection section 18. The stacked body 15 is provided on the substrate 10. The stacked body 15 includes a plurality of electrode layers 17, a plurality of insulating layers 16, a source side selection gate SGS, and a drain side selection gate SGD. The plurality of electrode layers 17 and the plurality of insulating layers 16 are, for example, stacked alternately one layer by one layer. The number of layers of the electrode layers 17 is arbitrary.

The source side selection gate SGS is provided on the insulating layer 16 located at the lowermost layer of the stacked body 15. The drain side selection gate SGD is provided on the uppermost layer of the stacked body 15.

The electrode layers 17 include, for example, a metal such as tungsten (W) or molybdenum (Mo) or the like. The electrode layers 17 may be layers including silicon as a main component, and for example, are polycrystalline silicon layers. In the case where the electrode layers 17 are silicon layers, the electrode layers 17 include, for example, boron (B) as an impurity for making the silicon layer conductive. The insulating layer 16 includes, for example, silicon oxide ($SiO_2$). The source side selection gate SGS and the drain side selection gate SGD are formed of, for example, the same material as the material forming the electrode layers 17.

In a source side transistor STS, the side selection gate SGS functions as a gate, and in a drain side selection transistor STD, the drain side selection gate SGD functions as a gate. A plurality of memory cells MC are connected in series between the source side selection transistor STS and the drain side selection transistor STD. In the memory cells MC, the electrode layers 17 function as a gate.

A plurality of columnar sections 25 extending in the Z-direction are provided in the stacked body 15. The columnar section 25 is, for example, provided cylindrically or elliptic cylindrically. The plurality of columnar sections 25 are disposed, for example, in staggered lattice-like or square lattice-like along the X-direction and the Y-direction.

A plurality of bit lines 41 are provided above the columnar sections 25. The plurality of bit lines 41 are formed of a metal and are separated in the X-direction, respectively and extend in the Y-direction.

The interconnection section 18 extending in the X-direction and the Y-direction is provided in the stacked body 15. The interconnection section 18 includes, for example, a metal such as tungsten or molybdenum or the like. The interconnection section 18 is constituted from a plurality of plate-like portions parallel to an X-Z plane. The plate-like portion is interposed between the adjacent stacked bodies 15, and for example, the plate-like portions are connected one another at ends of the stacked bodies 15 in the X-direction. In the example shown in FIG. 1, two plate-like portions of the interconnection section 18 are connected each other.

A source line 42 is provided above the interconnection section 18. The source line 42 is formed of a metal and extends in the Y-direction. An upper end of the interconnection section 18 is connected to the source line 42 via a contact plug (not shown).

As shown in FIG. 2, an insulating layer 11 is provided on the stacked body 15. An insulating layer 12 is provided on the insulating layer 11 and an insulating layer 13 is provided on the insulating layer 12. The insulating layer 11, the insulating layer 12 and the insulating layer 13 include, for example, silicon oxide.

The columnar section 25 includes a cylindrical core insulating portion 30, a semiconductor film 31 surrounding the core insulating portion 30, and a memory film 32 surrounding the semiconductor film 31. The core insulating portion 30 includes, for example, silicon oxide. The semiconductor film 31 includes silicon, for example, polysilicon crystallized from amorphous silicon. Shapes of the semiconductor film 31 and the memory film 32 are tubular, and a lower end of the semiconductor film 31 contacts the substrate 10. The core insulating portion 30 may not be provided.

A contact portion 35 and a contact portion 36 are provided on the columnar section 25. The contact portion 35 is connected to an upper end of the semiconductor film 31 and located within the insulating layer 12. The contact portion 36 is provided on the contact portion 35 and located within the insulating layer 13. The contact portion 36 is thinner than the contact portion 35. The contact portion 35 and the contact portion 36 are, for example, contact plugs, and are formed of stacked metal containing layers such as a tungsten layer and a titanium nitride layer or the like.

The bit line 41 is provided on the insulating layer 13, and connected to the semiconductor film 31 via the contact portion 35 and the contact portion 36. The plurality of semiconductor films 31 selected one by one from regions apart in the Y-direction are connected to one common bit line 41.

An insulating film 19 is provided on a side surface of the interconnection section 18. The insulating film 19 extends in the X-direction and the Z-direction as well as the interconnection section 18. The insulating film 19 includes, for example, silicon oxide. The insulating film 19 insulates the interconnection section 18 from the respective electrode layers 17 of the stacked body 15.

Figure 3:
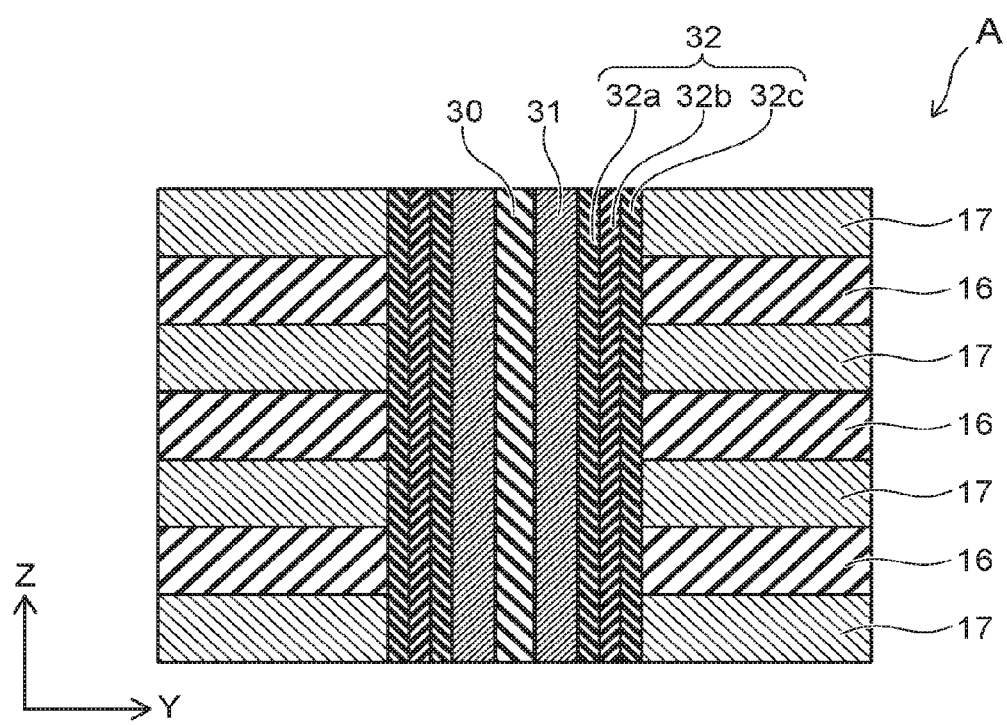
FIG. 3 is an enlarged cross-sectional view showing a part of the semiconductor memory device according to the embodiment.

FIG. 3 is an enlarged view of a region A in FIG. 2.

As shown in FIG. 3, the memory film 32 is a stacked film including a tunnel insulating film 32a, a charge storage film 32b and a block insulating film 32c. The block insulating film 32c, the charge storage film 32b and the tunnel insulating film 32a are provided between the stacked body 15 and the semiconductor film 31 in order from a side of the stacked body 15.

The tunnel insulating film 32a is, for example, a silicon oxide film of a single layer or an ONO film stacked with a silicon oxide film, a silicon nitride film and a silicon oxide film. The tunnel insulating film 32a is a potential barrier between the charge storage film 32b and the semiconductor film 31. In the tunnel insulating film 32a, when a charge transfers from the semiconductor film 31 to the charge storage film 32b (writing operation) and a charge transfers from the charge storage film 32b to the semiconductor film 31 (erasing operation), the charge tunnels.

The charge storage film 32b is a film for storing the charge, and is formed of a material having a trap site of an electron, for example, silicon nitride ($Si_3N_4$). The charge storage film 32b may be formed of hafnium oxide ($HfO_2$). The memory cells MC including the charge storage film 32b are formed at cross points of the semiconductor film 31 and the electrode layers 17. A threshold value of the memory cells MC changes depending on presence or absence of the charge trapped at the trap site and the trapped charge amount. Thereby, the memory cells MC hold information.

The block insulating film 32c is, for example, a silicon oxide film of a single layer or a stacked film stacked with a silicon oxide film, and an aluminum oxide film made of aluminum oxide ($Al_2O_3$). The block insulating film 32c protects, for example, the charge storage film 32b from being etched when the electrode films 17 are formed. The memory film 32 capable of storing the charge is constituted from the tunnel insulating film 32a, the charge storage film 32b and the block insulating film 32c. Therefore, the memory film 32 is disposed between the semiconductor film 31 and the electrode layers 17.

Figure 4:
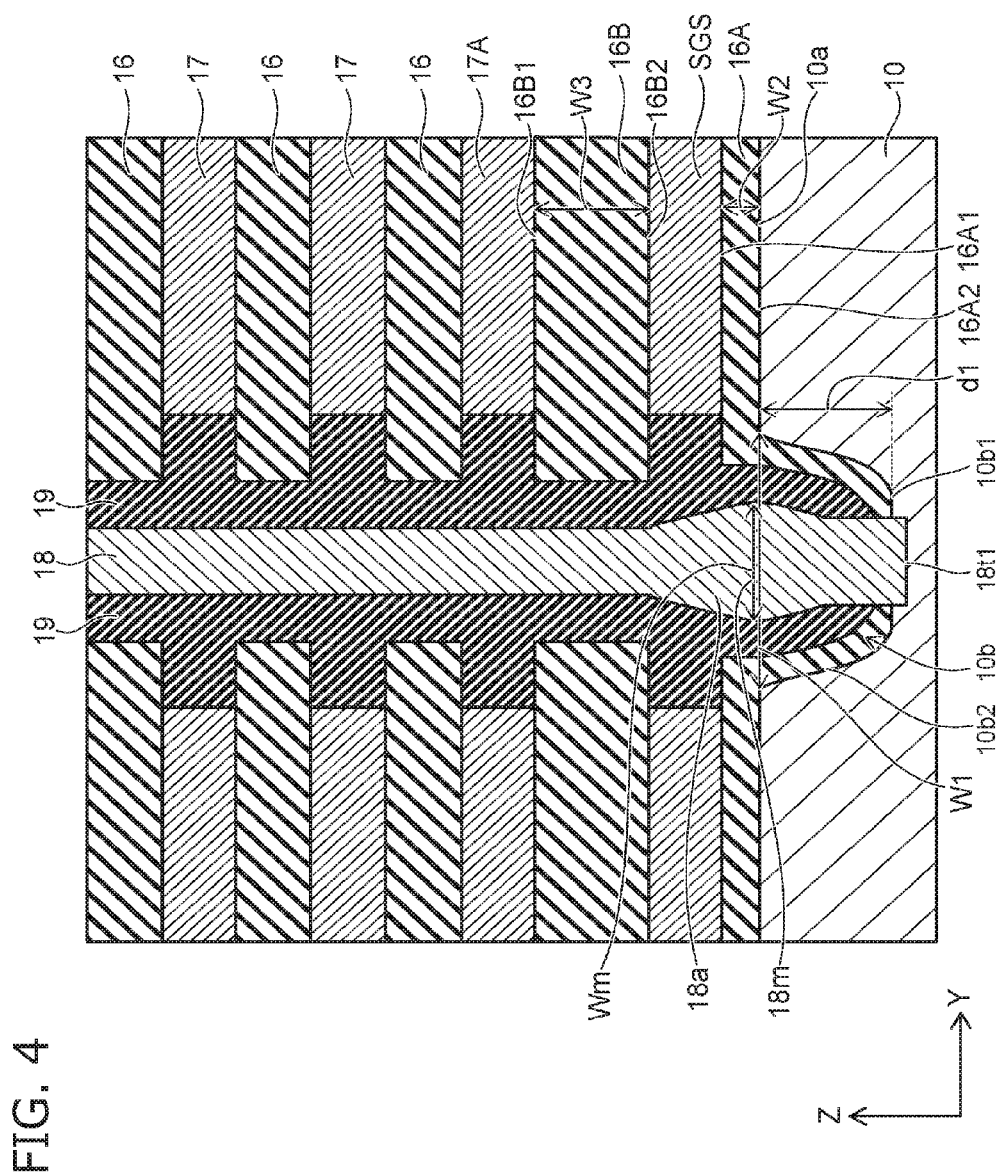
FIG. 4 and FIG. 5 are enlarged cross-sectional views showing parts of the semiconductor memory device according to the embodiment.
Figure 5:
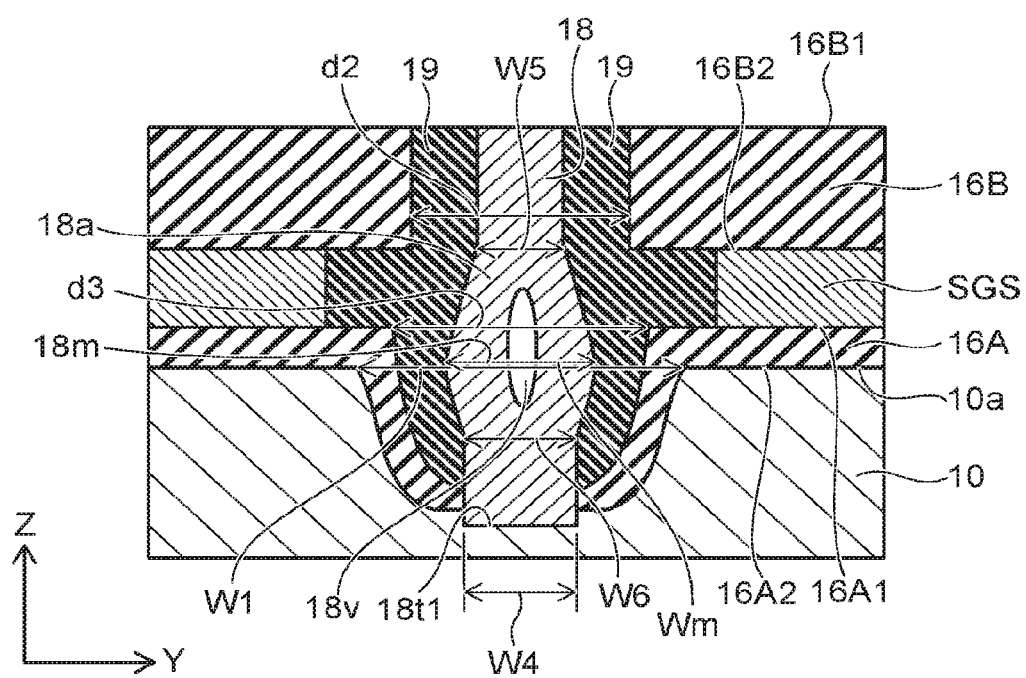

FIG. 4 is an enlarged view of a region B in FIG. 2. FIG. 5 is an enlarged view of a part of FIG. 4.

As shown in FIG. 4, a recess 10b having a width W1 and a depth d1 is formed in the substrate 10. The width W1 is a width of the Y-Z cross section in the Y-direction in the example of FIG. 4. The depth d1 is a depth from the upper surface 10a of the substrate 10 to a bottom surface 10b1 of the recess 10b. For example, the shape of the recess 10b has an arc partially.

An insulating layer 16A, the source side selection gate SGS, an insulating layer 16B and an electrode layer 17A are sequentially stacked on the substrate 10 below the stacked body 15. A part of the insulating layer 16A is provided on an inner wall surface 10b2 of the recess 10b. For example, a width W2 of the insulating layer 16A in the Z-direction is smaller than a width W3 of the insulating layer 16B in the Z-direction.

The interconnection section 18 is provided in the stacked body 15, and its lower end 18t1 contacts the substrate 10. For example, a portion of the lower end 18t1 contacting the substrate is located below the bottom surface 10b1 of the recess 10b. In this case, a part of the interconnection section 18 is buried below the bottom surface 10b1.

A swelled portion 18a is formed in the interconnection section 18. The swelled portion 18a is a swelled portion where a side surface of the interconnection section 18 is swelled on both sides of the Y-direction.

If a portion where the width of the swelled portion 18a in the Y-direction has a maximum value Wm is taken as a thickest portion 18m, a position of the thickest portion 18m in the Z-direction is located between an upper surface 16A1 and a lower surface 16A2 of the insulating layer 16A.

The upper surface 16A1 faces the source side selection gate SGS, and the lower surface 16A2 faces the substrate 10 (upper surface 10a). Here, "face" includes the case where another constituent element is provided to contact directly on or below a certain constituent element and the case where other layer or film is provided to be interposed between the constituent elements.

A position of an upper end of the swelled portion 18a in the Z-direction is generally the same as a position of a lower surface 16B2 of the insulating layer 16B, and a position of a lower end of the swelled portion 18a in the Z-direction is in the recess 10b of the substrate 10. The lower surface 16B2 is a surface opposite to the upper surface 16B1 and faces the source side selection gate SGS. The upper surface 16B1 faces the electrode layer 17A.

As shown in FIG. 5, a width W4 of the lower end 18t1 of the interconnection section 18 in the Y-direction is smaller than a width Wm of the thickest portion 18m of the swelled portion 18a in the Y-direction. The width W4 is generally the same as a width W5 of the upper end of the swelled portion 18a in the Y-direction and a width W6 of the lower end of the swelled portion 18a in the Y-direction.

The width W1 of the recess 10b is larger than a distance d2 between the adjacent insulating layers 16B in the Y-direction. A distance d3 between the adjacent insulating layers 16A in the Y-direction is larger than the distance d2.

The whole of the interconnection section 18 is not necessary to be formed of a metal material, and as shown in FIG. 5, a void 18v may be included in the part. For example, in the case where the void 18v is formed in the swelled portion 18a, the width Wm of the thickest portion 18m in the Y-direction corresponds to the width of the thickest portion 18m including the void 18v.

Hereinafter, a method for manufacturing the semiconductor memory device 1 will be described.

Figure 6:
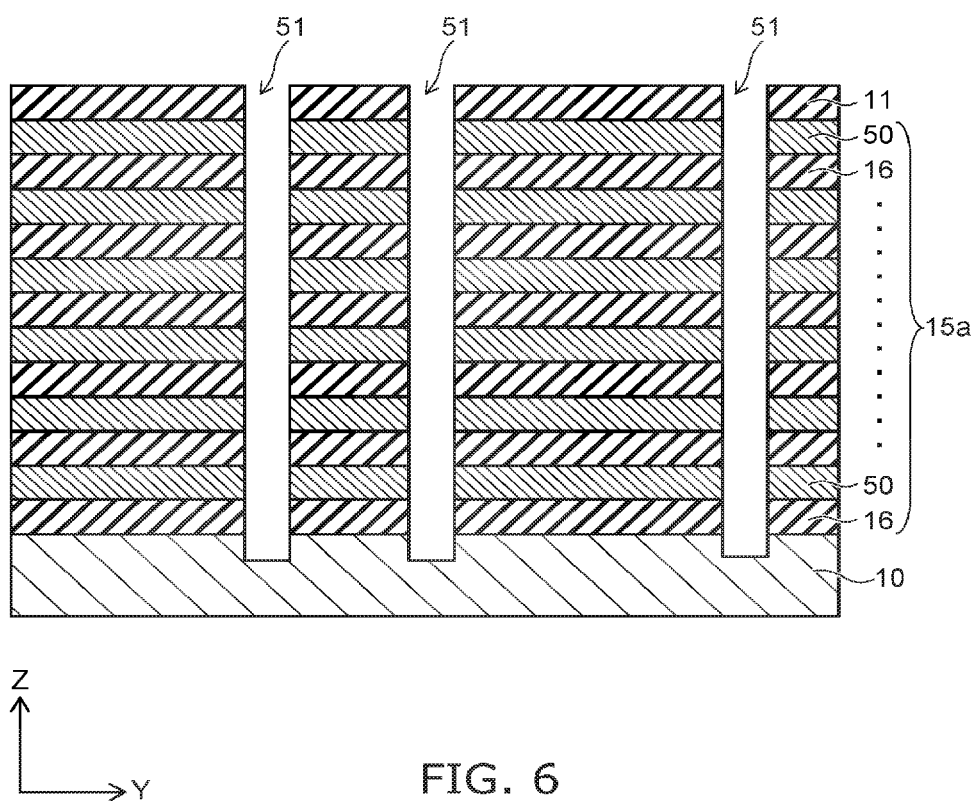
FIG. 6 to FIG. 16 are cross-sectional views showing a method for manufacturing the semiconductor memory device according to the embodiment.
Figure 7:
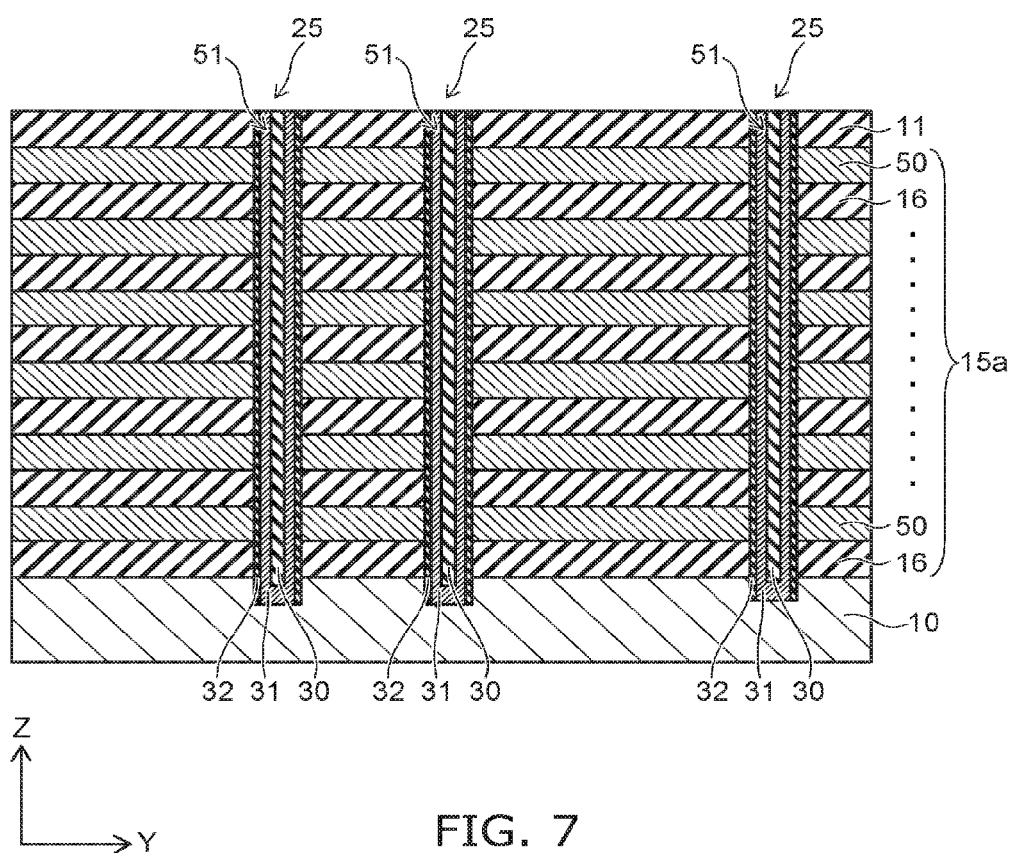
Figure 8:
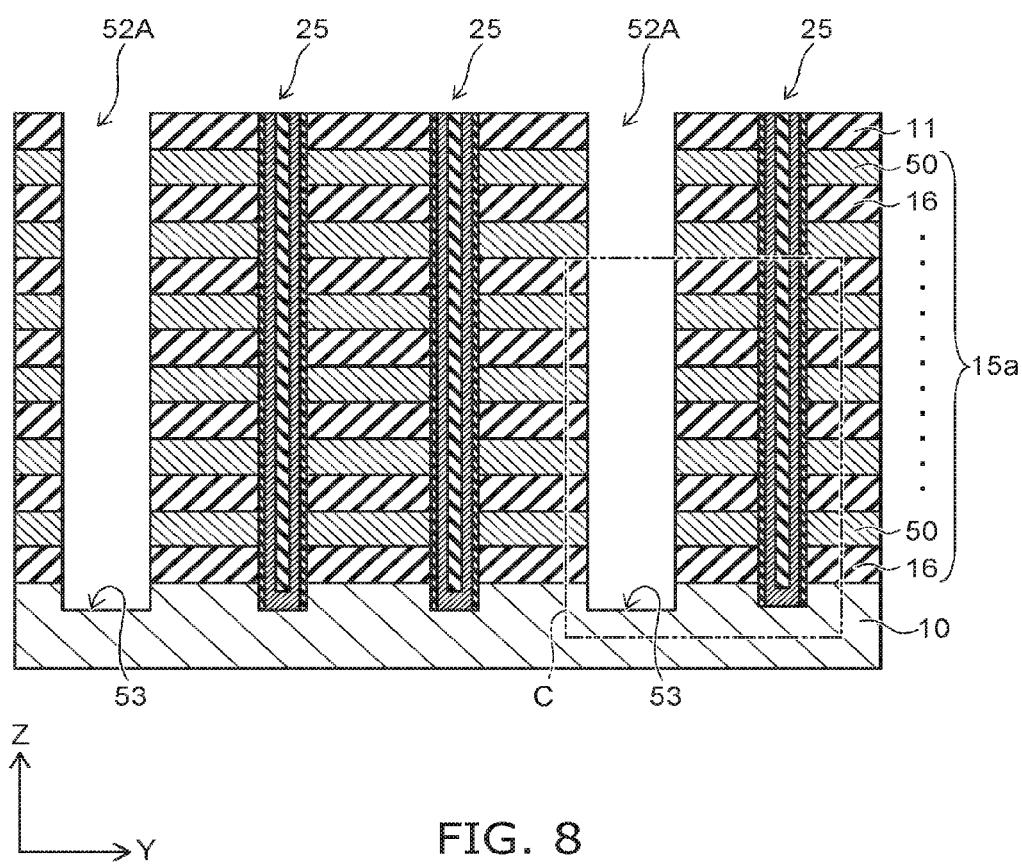

FIG. 6 to FIG. 8 are cross-sectional views showing the method for manufacturing the semiconductor memory device according to the embodiment.

Firstly, using FIG. 6 to FIG. 8, a flow of the method for manufacturing the semiconductor memory device 1 will be described simply. Cross-sections of FIG. 6 to FIG. 8 correspond to the cross-section of FIG. 2 and show a portion lower than the insulating layer 12.

Firstly, a stacked body 15a is formed on the substrate 10 by alternately stacking the insulating layers 16 and sacrifice layers 50 along the Z-direction by, for example, a CVD (Chemical Vapor Deposition) method. The insulating layers 16 are formed of, for example, silicon oxide. The sacrifice layers 50 are formed of a material which an etching selection ratio is obtained to the insulating layers 16, for example, formed of silicon nitride. Subsequently, the insulating layer 11 is formed on the stacked body 15a. On the other hand, a control circuit (not shown) or the like controlling the memory cells MC is formed on the substrate.

Next, as shown in FIG. 6, a plurality of memory holes 51 (through holes) are formed in the insulating layer 11 and the stacked body 15a by, for example, a photolithography method and RIE (Reactive Ion Etching). The memory holes 51 extend in the Z-direction, pierce the insulating layer 11 and the stacked body 15a, and reach the substrate 10. The shape of the memory hole 51 is circular viewed in the Z-direction. The memory holes 51 are disposed, for example, to be staggered viewed in the Z-direction.

Next, as shown in FIG. 7, the memory film 32, the semiconductor film 31 and the core insulating portion 30 are formed in the memory hole 51. Thereby, the columnar section 25 is formed. By, for example, the CVD method, silicon oxide is deposited on an inner surface of the memory hole 51 to form the block insulating film 32c, silicon nitride is deposited to form the charge storage film 32b, and silicon oxide is deposited to form the tunnel insulating film 32a. Thereafter, the tunnel insulating film 32a, the charge storage film 32b and the block insulating film 32c are removed from a bottom surface of the memory hole 51 by performing the RIE, and the substrate 10 is exposed. Subsequently, after silicon is deposited to form the semiconductor film 31, silicon oxide is deposited to form the core insulating portion 30. The lower end of the semiconductor film 31 contacts the substrate 10.

Next, as shown in FIG. 8, a plurality of slits 52A extending in the X-direction are formed in the stacked body 15a by, for example, the photolithography method and an anisotropic etching such as the RIE or the like. The slits 52A are pierced through the stacked body 15a. Thereby, the stacked body 15a is divided into a plurality of stacked bodies extending in the X-direction by the slits 52A. A part of the substrate is removed by the slits 52A, and recesses 53 are formed in the substrate 10.

The simple flow of the method for manufacturing the semiconductor memory device 1 is described above, however in the embodiment, after the step of FIG. 8 described above, the insulating film 19, the stacked body 15 and the interconnection section 18 are formed as described below. This will be described based on FIG. 9 to FIG. 16. FIG. 9 to FIG. 16 are enlarged views showing a formation process of a region C after the step of FIG. 8.

Figure 9:
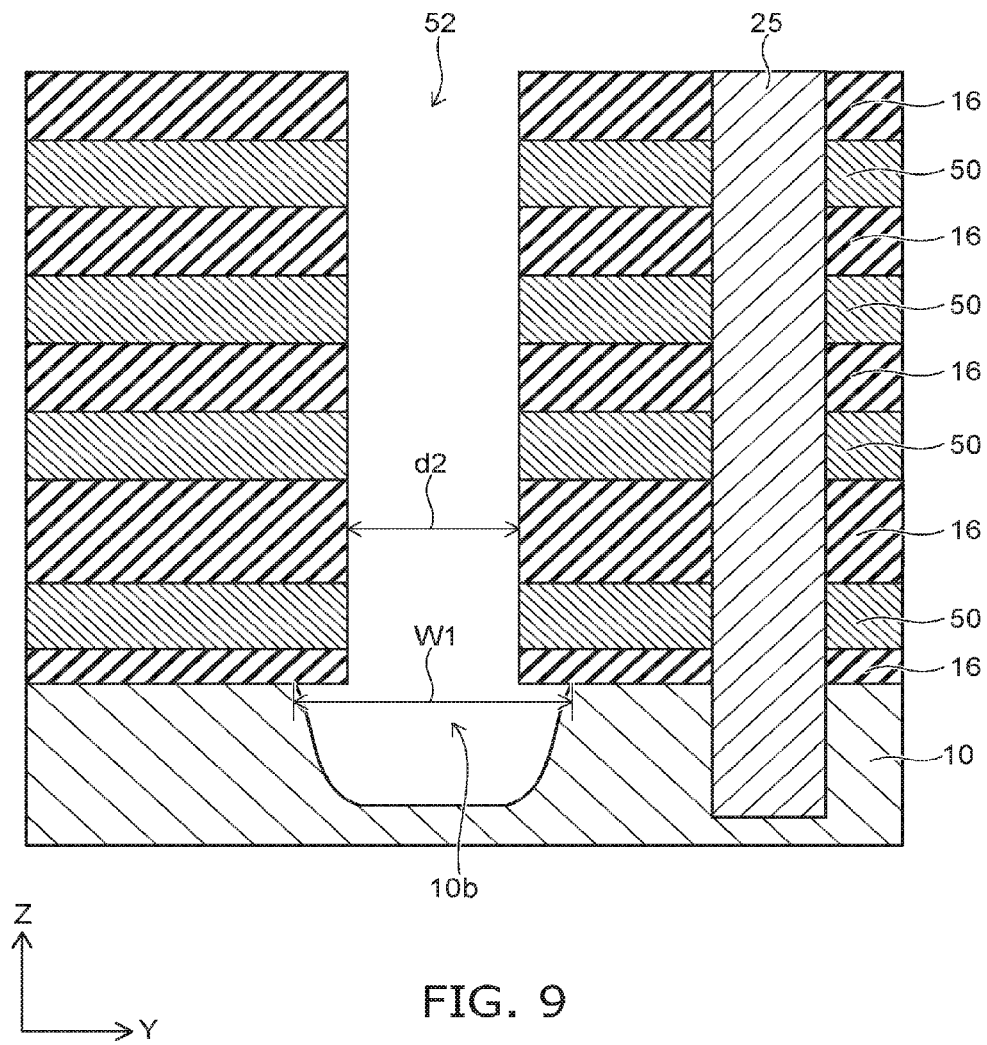

As shown in FIG. 9, a part of the substrate 10 is further removed and the recess 10b is formed in the substrate 10. The recess 10b is formed by, for example, at least one of RIE, wet etching and CDE (Chemical Dry Etching). The recess 10b is a portion formed by enlarging the recess 53 in FIG. 8, and, for example, the shape has an arc partially. The width W1 of the recess 10b is larger than the distance d2 between the adjacent insulating layers 16 in the Y-direction. A slit 52 having the slits 52A and the recess 10b is formed by forming the recess 10b.

Figure 10:
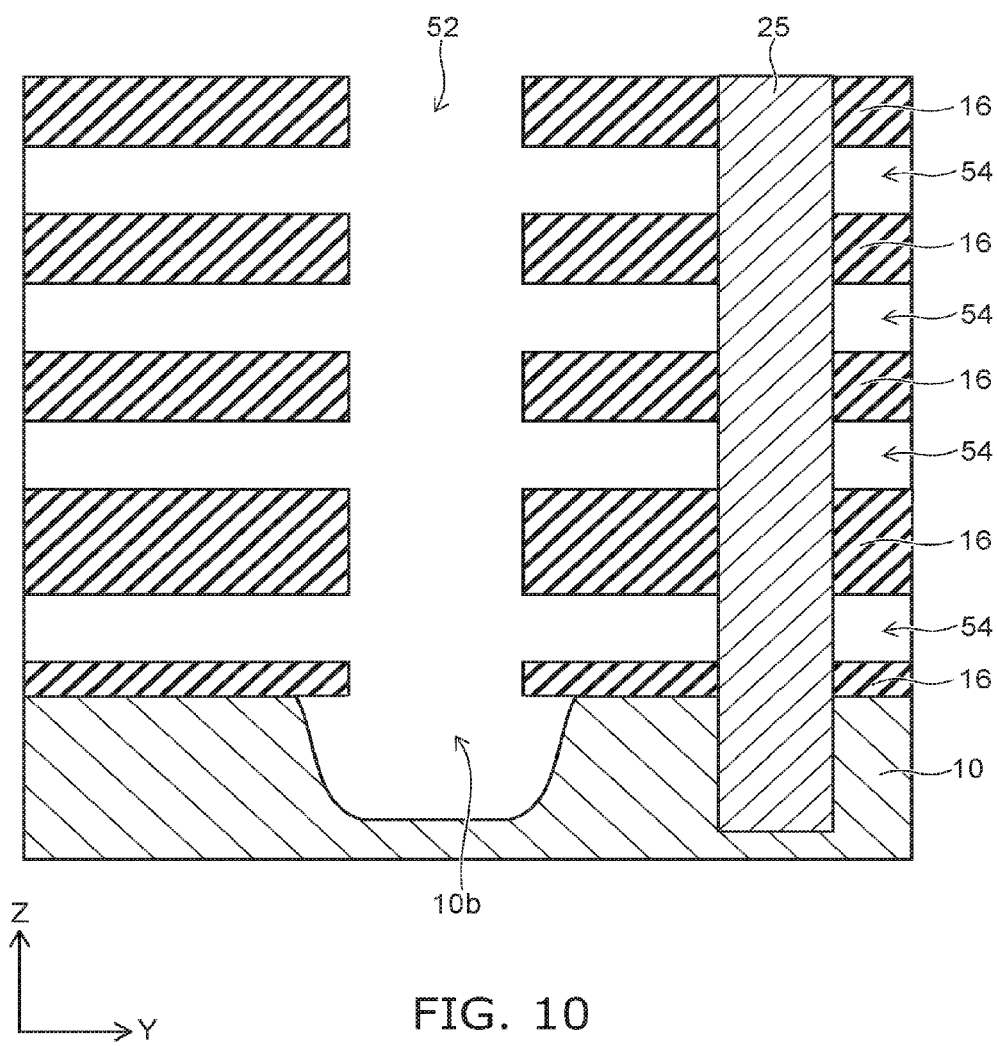

Next, as shown in FIG. 10, the sacrifice layer 50 is removed by etching via the slit 52. For example, in the case of forming the sacrifice layer 50 of silicon nitride, the sacrifice layer 50 is removed by the wet etching. In this case, phosphoric acid is used for etchant of the wet etching, and thermos-phosphoric acid is used for processing. The sacrifice layer 50 may be removed by the dry etching. A cavity 54 is formed by removing the sacrifice layer 50 via the slit 52.

Figure 11:
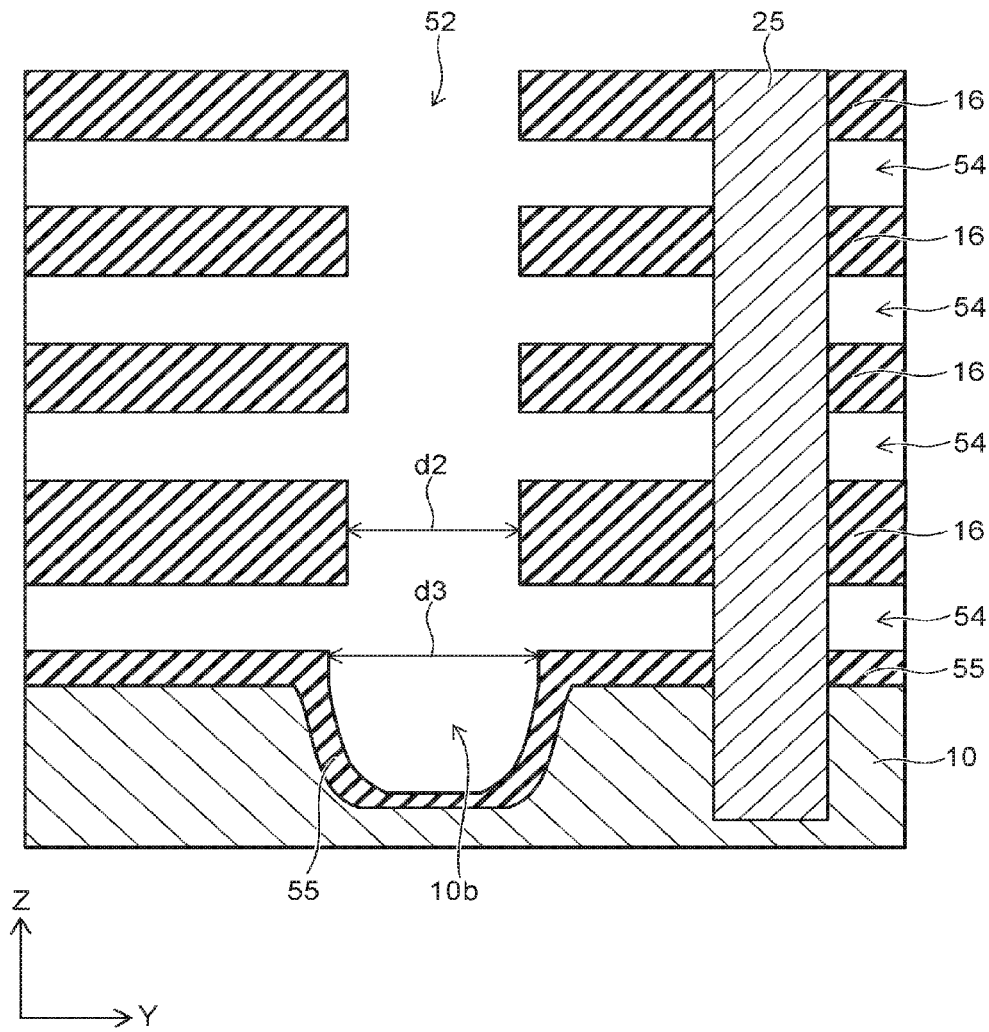

Next, as shown in FIG. 11, after removing the insulating layer 16 formed on the substrate 10 via the slit 52 and the cavity 54, an insulating layer 55 is formed on the substrate 10. The insulating layer 55 is formed by, for example, depositing silicon oxide using the CVD method. As described above, the width W1 of the recess 10b is larger than the distance d2 between the adjacent insulating layers 16 in the Y-direction. A distance d3 between the adjacent insulating layers 55 in the Y-direction becomes larger than the distance d2 between the adjacent insulating layers 16 in the Y-direction by formation of the recess 10b like this.

Figure 12:
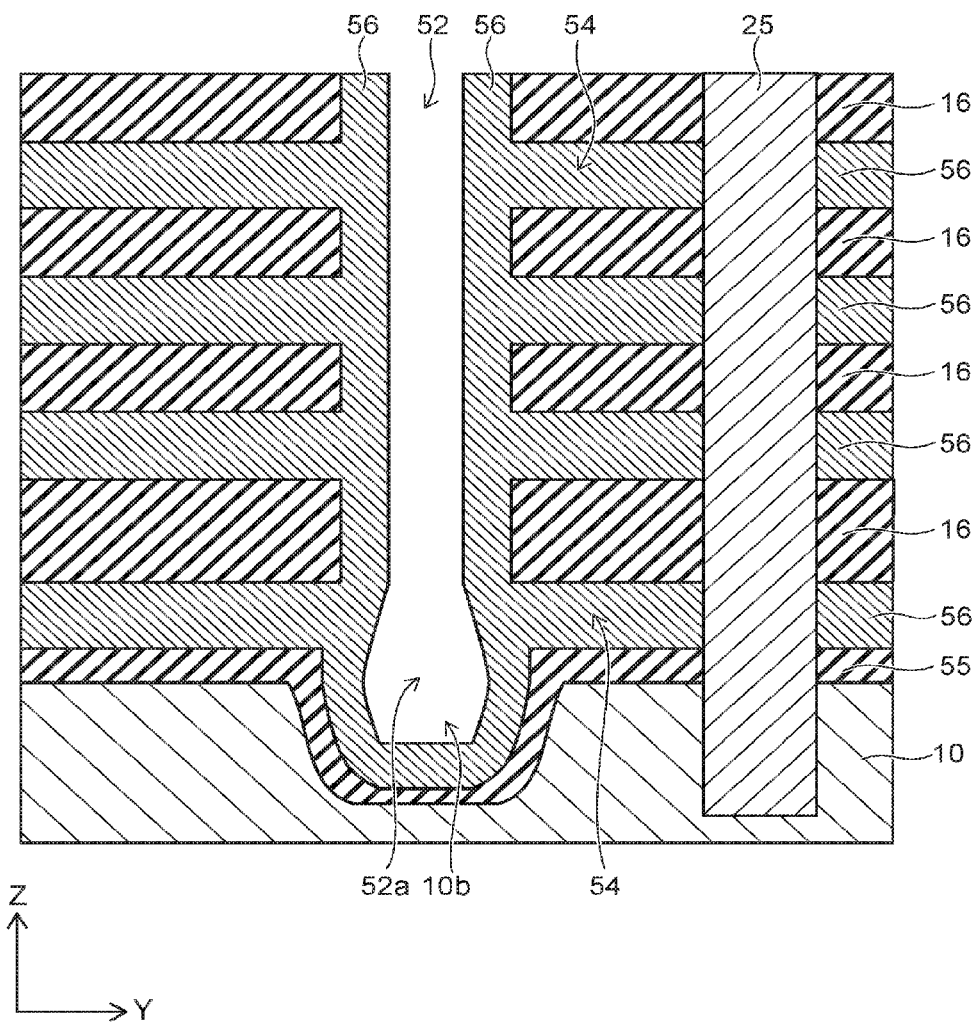

Next, as shown in FIG. 12, a conductive layer 56 is formed all over via the slit 52 by, for example, the CVD method. The conductive layer 56 includes, for example, tungsten. The conductive layer 56 is formed on an inner wall surface of the slit 52 and in the cavity 54 and the recess 10b. In FIG. 11, because of formation of the recess 10b, the distance d3 between the adjacent insulating layers 55 in the Y-direction is larger than the distance d2 between the adjacent insulating layers 16 in the Y-direction. Thereby, a wide width portion 52a having a wide width and surrounded by the conductive layer 56 is formed in the slit 52.

Figure 13:
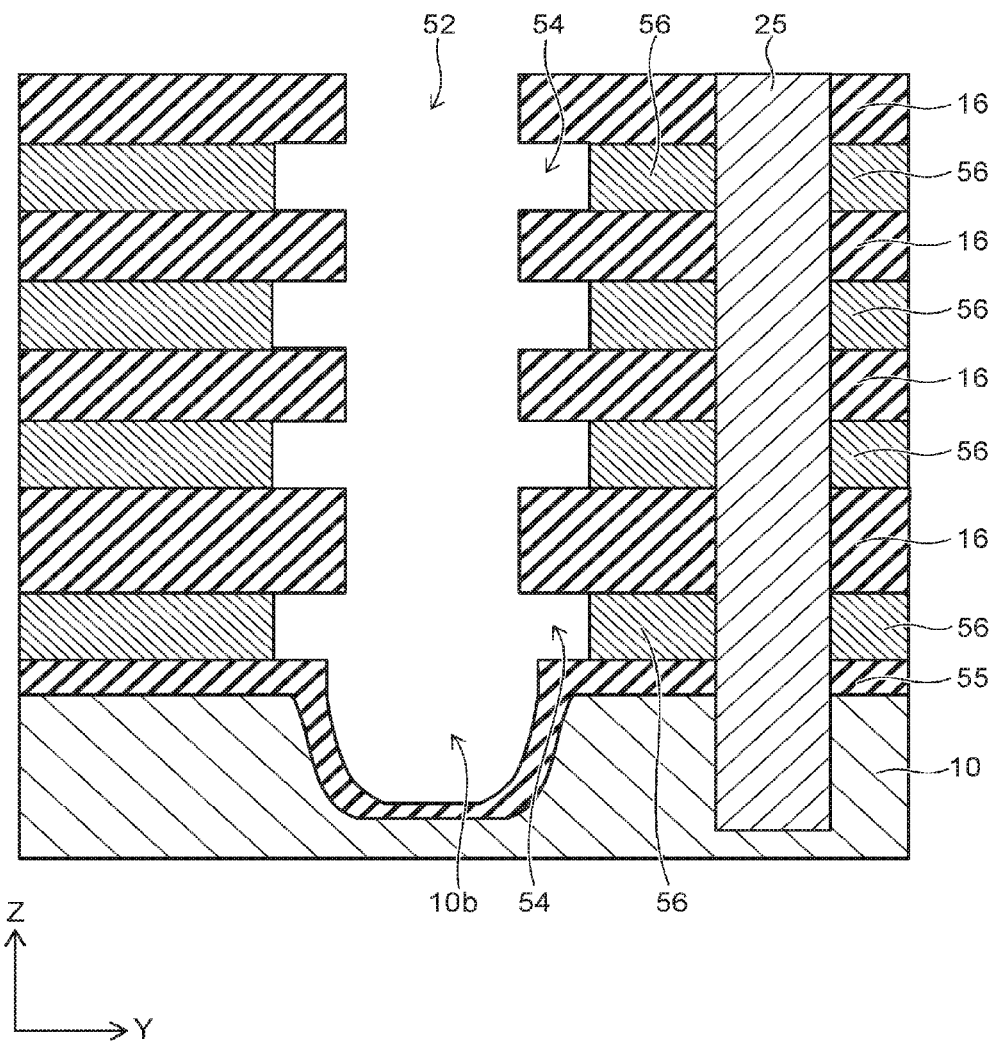

Next, as shown in FIG. 13, the conductive layer 56 is etched by an isotropic etching such as the CDE or the wet etching or the like to avoid short circuit of the adjacent conductive layers 56 in the Z-direction. The conductive layer 56 is etched to recede into the cavity 54 by the etching.

Figure 14:
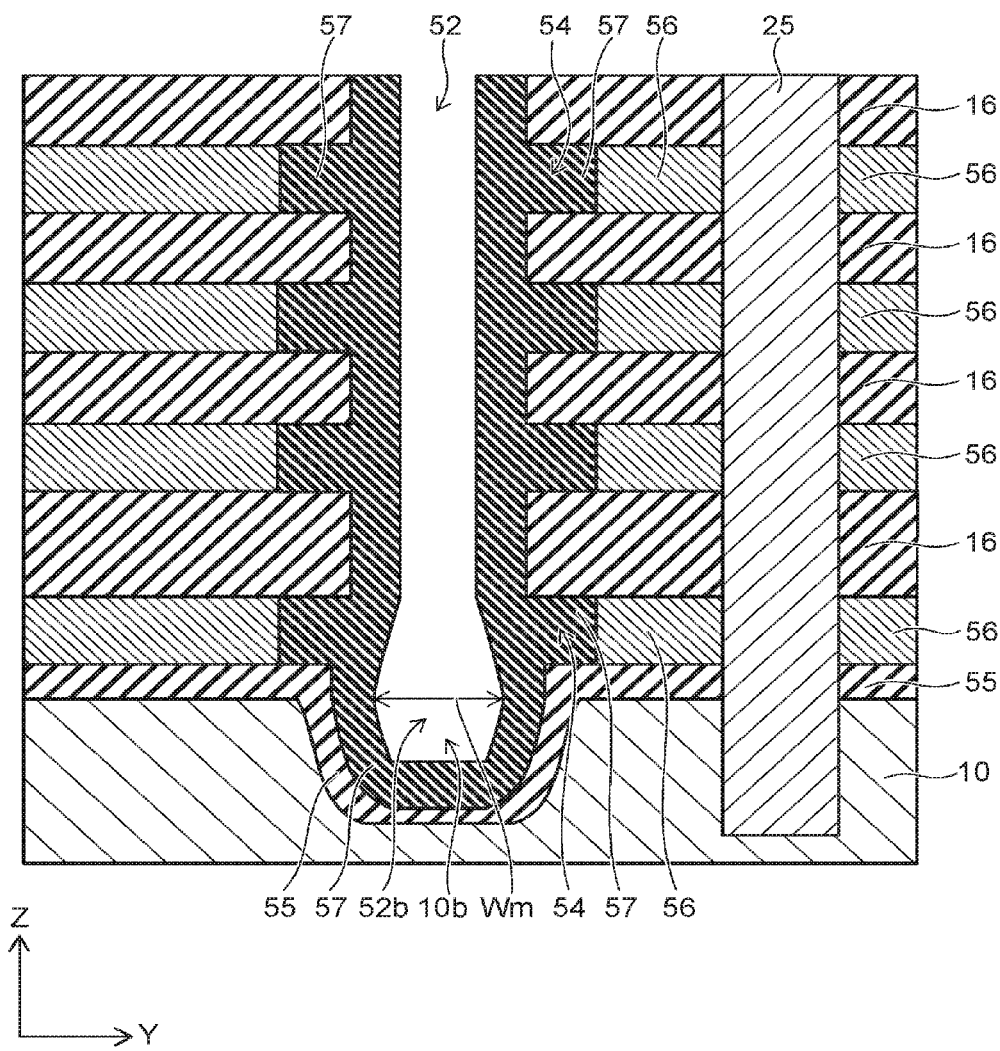

Next, as shown in FIG. 14, an insulating film 57 is formed in the cavity 54 and on a side surface of the slit 52. The insulating film 57 is formed also on the insulating layer 55 in the recess 10b. The insulating film 57 is, for example, a film including silicon oxide. In FIG. 11, because of formation of the recess 10b, the distance d3 between the adjacent insulating layers 55 in the Y-direction is larger than the distance d2 between the adjacent insulating layers 16 in the Y-direction. Thereby, a wide width portion 52b having a wide width and surrounded by the insulating film 57 is formed in the slit 52. For example, the wide width portion 52b has a maximum value Wm.

Figure 15:
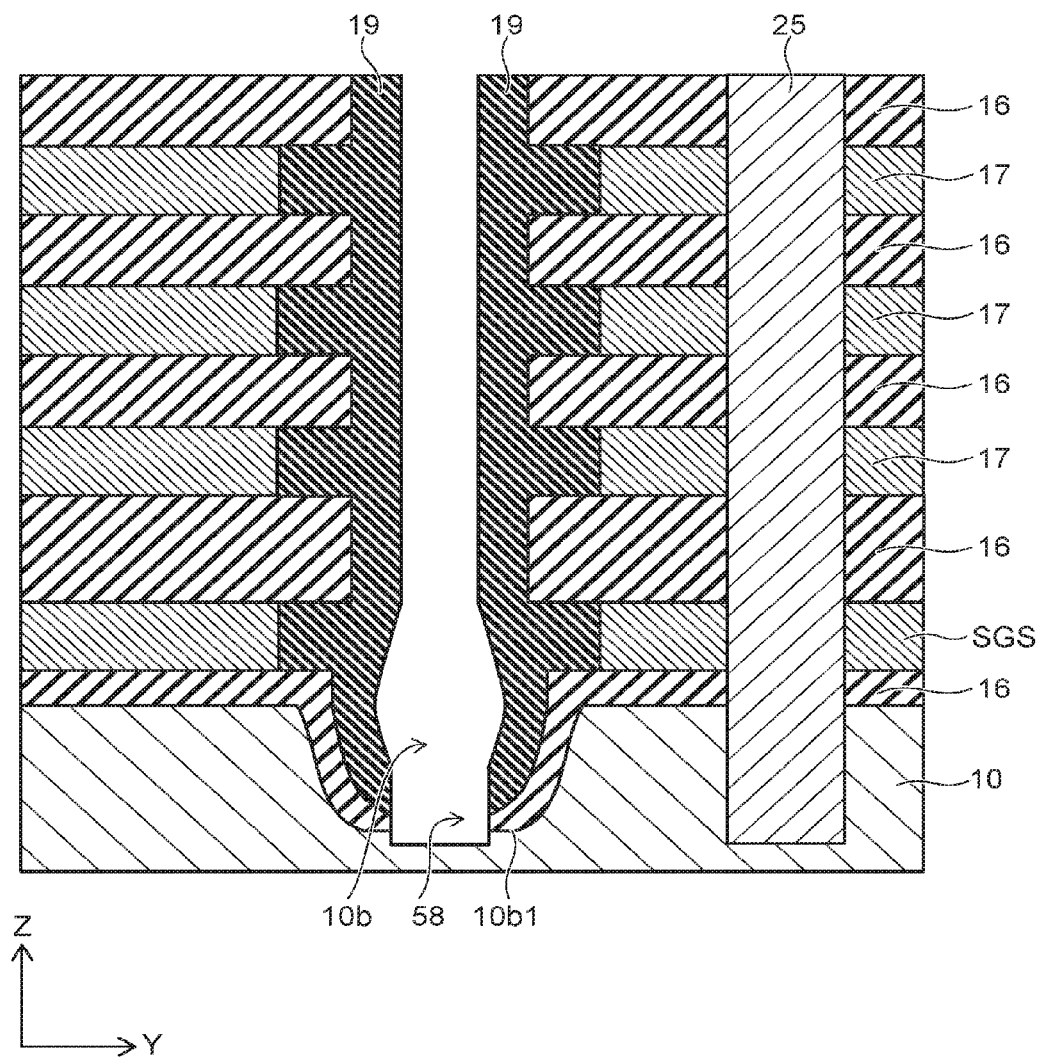

Next, as shown in FIG. 15, a part of the substrate 10 is removed with a part of the insulating film 57 and a part of the insulating layer 55 in the recess 10b by an anisotropic etching such as the RIE or the like to form a contact hole 58. The contact hole 58 is formed below the bottom surface 10b1 of the recess 10b. Thereby, an insulating film 19 is formed. The stacked body 15 including the plurality of electrode layers 17, the plurality of insulating layers 16, the source side selection gate SGS and the drain side selection gate SGD is formed.

Figure 16:
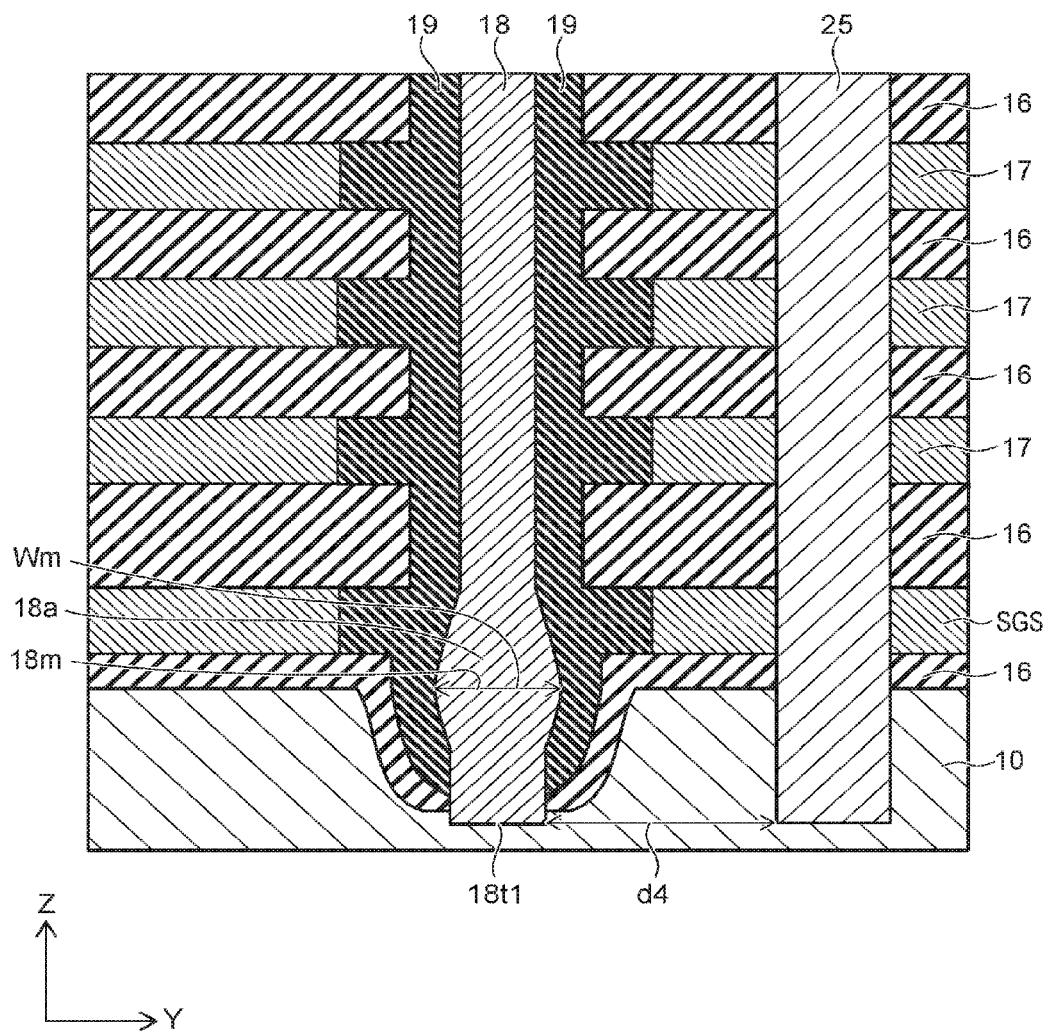

Next, as shown in FIG. 16, a conductive film is formed by depositing tungsten or molybdenum thickly. Thereby, the interconnection section 18 is formed in the slit 52. The interconnection section 18 has the swelled portion 18a, and the swelled portion 18a is formed in the wide width portion 52b in FIG. 14. The swelled portion 18a has the thickest portion 18m where the width in the Y-direction has the maximum value Wm. A distance between the lower end 18t1 of the interconnection section 18 and the columnar section 25 is represented by a distance d4.

Thereafter, the insulating layer 12 is formed on the insulating layer 11, and a contact hole is formed in the insulating layer 12 in a region immediately above the columnar section 25. The contact portion 35 is formed in the contact hole by burying a metal material of tungsten or the like in the contact hole. Subsequently, the insulating layer 13 is formed on the insulating layer 12, a contact hole is formed in the insulating layer 13 in a region immediately above the contact portion 35, and then the contact portion 36 is formed. The contact portion 35 and the contact potion 36 are formed by, for example, the photolithography method and the etching. Subsequently, a conductive film is formed on the insulating layer 13 and is patterned by the RIE or the like, and thus the bit lines 41 extending in the Y-direction are formed.

In this manner, the semiconductor memory device 1 according to the embodiment is manufactured.

In the following, the effects of the embodiment will be described.

Figure 17:
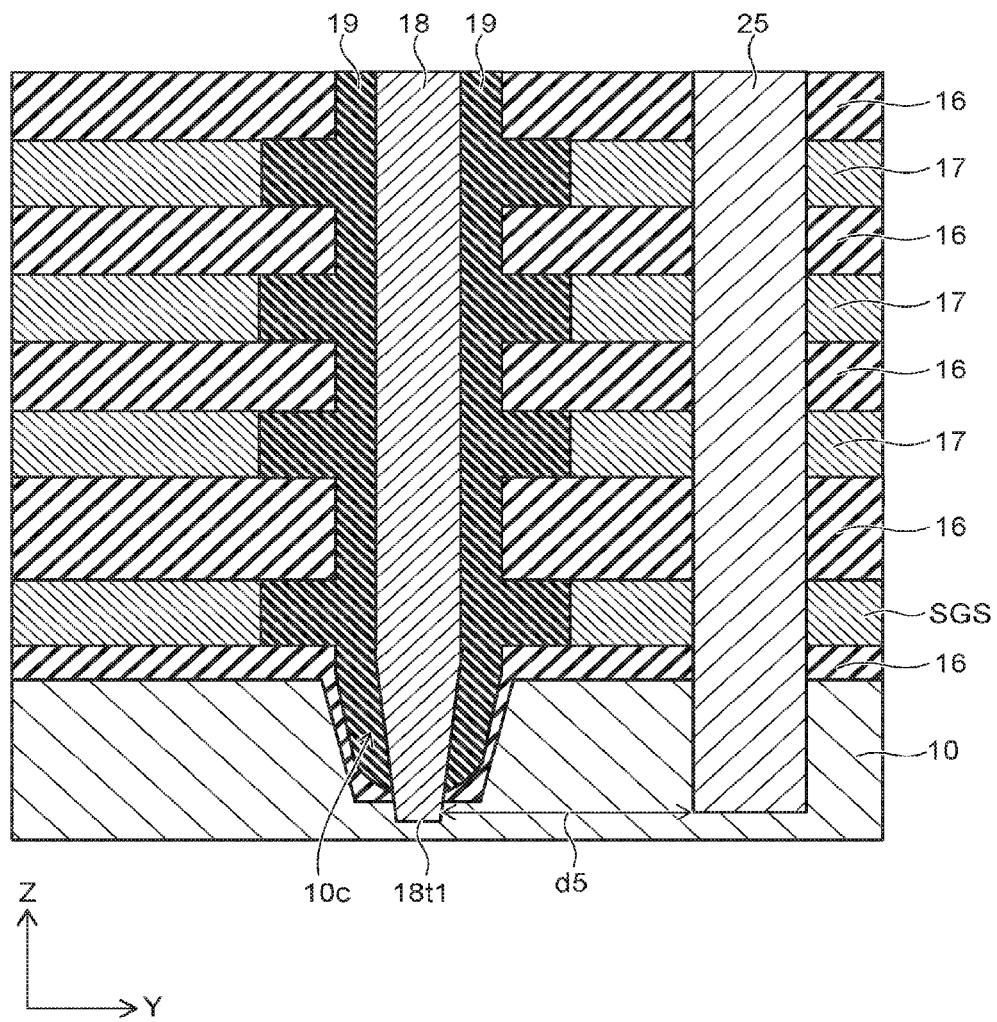
FIG. 17 is a reference view showing a part of a semiconductor memory device.

FIG. 17 is a reference view showing a cross-section of a part of a semiconductor memory device. The cross-section of FIG. 17 corresponds to the cross-section of FIG. 16.

The swelled portion 18a with an increased width is formed in the interconnection section 18 of the semiconductor memory device 1 according to the embodiment. When the interconnection section 18 is provided like this, the width of the lower end 18t1 of the interconnection section 18 can be suppressed from decreasing. This allows a contact area of the interconnection section 18 and the substrate 10 to increase. The distance between the interconnection section 18 and the columnar section 25 is suppressed from increasing, and a flow of a current is made easier through the semiconductor film 31 of the columnar section 25 via the substrate 10. Therefore, the failure of the memory cell MC can be suppressed from occurring.

Here, in the semiconductor memory device with the 3-dimensional structure, the slit reaching the substrate is formed in the stacked body in order to form the electrode layer and the interconnection section, and the interconnection section reaching the substrate is formed by forming the conductive film in the slit. In the case of forming the slit by the etching, the substrate functions as a stopper for stopping the etching processing, and formation of the taper-shaped recess in the substrate is made easier.

For example, as shown in FIG. 17, in the case of forming the interconnection section 18 in the taper-shaped recess 10c, the width of the lower end 18t1 of the interconnection section 18 is easy to be small. Thereby, the distance (for example, the distance d5 in FIG. 17) between the lower end 18t1 of the interconnection section 18 and the columnar section 25 is made large, and a flow of a current is made harder through the semiconductor film 31 of the columnar section 25 via the substrate 10.

In the embodiment, as shown in FIG. 9, after forming the slit 52A, a part of the substrate 10 is removed to form the recess 10b. The width W1 of the recess 10b is larger than the distance d2 between the adjacent insulating layers 16B in the Y-direction. When the recess 10b like this is formed, the interconnection section 18 having the swelled portion 18a with the increased width is formed, and in the swelled portion 18a, the thickest portion 18m with the maximum width can be formed between the upper surface 16A1 and the lower surface 16A2 of the insulating layer 16A. Thereby, the width of the lower end 18t1 of the interconnection section 18 can be large in comparison with the case of forming the taper-shaped recess 10c like FIG. 17, and thus the contact area of the interconnection section 18 and the substrate 10 can be increased. The distance (the distance d4 in FIG. 16) between the interconnection section 18 and the columnar section 25 decreases and a flow of a current is made easier through the semiconductor film 31 of the columnar section 25 via the substrate 10.

In the embodiment, the recess 10b is formed so that the width W1 is larger than the distance d2 between the adjacent insulating layers 16b in the Y-direction, and thus the width of the bottom surface 10b1 is easy to be large. Thereby, as shown in FIG. 13, when the conductive layer 56 is receded into the cavity 54 by the etching, the conductive layer 56 is hard to remain in the recess 10b. Therefore, the conductive layer 56 can be easily removed by the etching.

According to the embodiment described above, the semiconductor memory device capable of suppressing the failure from occurring in the memory cell can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   a substrate;
   a stacked body provided on the substrate, and including a plurality of insulating layers and a plurality of electrode layers alternately stacked one layer by one layer;
   a columnar section including a semiconductor film extending in a stacking direction of the stacked body and a charge storage film provided between the semiconductor film and the stacked body; and
   an interconnection section provided in the stacked body, expanding along the stacking direction and a first direction perpendicular to the stacking direction, and contacting the substrate,
   the stacked body including a first insulating layer provided on the substrate, a first electrode layer provided on the first insulating layer, a second insulating layer provided on the first electrode layer, and a second electrode layer provided on the second insulating layer,
   the first insulating layer including a first surface facing the substrate, and a second surface facing the first electrode layer, the second surface being a surface opposite to the first surface,
   the second insulating layer including a third surface facing the first electrode layer, and a fourth surface facing the second electrode layer, the fourth surface being a surface opposite to the third surface, and
   a width of the interconnection section located between the first surface and the second surface in a second direction perpendicular to the stacking direction and the first direction being larger than a width of the interconnection section located between the third surface and the fourth surface in the second direction.

2. The semiconductor memory device according to claim 1, wherein a distance between the first insulating layers interposing the interconnection section is larger than a distance between the second insulating layers interposing the interconnection section.

3. The semiconductor memory device according to claim 1, wherein
   the substrate includes a recess formed with a prescribed depth from a surface facing the first surface, and
   a part of the first insulating layer is located in the recess.

4. The semiconductor memory device according to claim 3, further comprising:
   a first insulating film provided between the stacked body and the interconnection section,
   a part of the first insulating film being located in the recess.

5. The semiconductor memory device according to claim 3, wherein a width of the recess in the second direction is larger than a distance between the second insulating layers interposing the interconnection section.

6. The semiconductor memory device according to claim 3, wherein a shape of the recess has an arc partially.

7. The semiconductor memory device according to claim 1, wherein a lower end of the interconnection section is located in the substrate.

8. The semiconductor memory device according to claim 1, wherein the interconnection section includes tungsten or molybdenum.

9. The semiconductor memory device according to claim 1, wherein the interconnection section has a thickest portion having a maximum width in the second direction between the first surface and the second surface.

10. The semiconductor memory device according to claim 9, wherein a width of the thickest portion in the second direction is larger than a width of a lower end of the interconnection section in the second direction.

11. The semiconductor memory device according to claim 1, wherein,
    the substrate includes a recess formed with a prescribed depth from a surface facing the first surface,
    the interconnection section includes a swelled portion having a side surface swelled in the second direction,
    one end of the swelled portion is located in the recess, and
    a position of another end of the swelled portion is generally same as a position of the third surface.

12. The semiconductor memory device according to claim 11, wherein the swelled portion has a thickest portion having a maximum width in the second direction between the first surface and the second surface.

13. The semiconductor memory device according to claim 11, wherein a part of the first insulating layer is located in the recess.

14. The semiconductor memory device according to claim 11, further comprising:
    a first insulating film provided between the stacked body and the interconnection section,
    a part of the first insulating film being located in the recess.

15. The semiconductor memory device according to claim 11, wherein a width of the recess in the second direction is larger than a distance between the second insulating layers interposing the interconnection section.

16. The semiconductor memory device according to claim 11, wherein a shape of the recess has an arc partially.

17. The semiconductor memory device according to claim 11, wherein a lower end of the interconnection section is below a bottom surface of the recess and is located in the substrate.

18. The semiconductor memory device according to claim 17, wherein a width of another end of the swelled portion in the second direction is generally same as a width of the lower end in the second direction.

19. The semiconductor memory device according to claim 1, wherein a width of the first insulating layer in the stacking direction is smaller than a width of the second insulating layer in the stacking direction.

20. The semiconductor memory device according to claim 1, wherein the first electrode layer is a source side selection gate.

* * * * *